(12) United States Patent
Kitagawa et al.

(10) Patent No.: US 8,716,819 B2
(45) Date of Patent: May 6, 2014

(54) MAGNETIC RANDOM ACCESS MEMORY

(75) Inventors: Eiji Kitagawa, Yokohama (JP);
Naoharu Shimomura, Tokyo (JP);
Tsuneo Inaba, Kamakura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/429,088

(22) Filed: Mar. 23, 2012

(65) Prior Publication Data
US 2013/0037862 A1   Feb. 14, 2013

(30) Foreign Application Priority Data

Aug. 12, 2011 (JP) ................................. 2011-176687

(51) Int. Cl.
*H01L 29/82* (2006.01)

(52) U.S. Cl.
USPC .................. 257/421; 257/252; 257/E21.665; 257/E29.323; 438/3

(58) Field of Classification Search
USPC .................. 257/252, E29.167, 421, E21.665, 257/E29.323; 438/73, 3
See application file for complete search history.

(56) References Cited

U.S. PATENT DOCUMENTS

| | | | | |
|---|---|---|---|---|
| 6,392,923 B1 * | 5/2002 | Naji | ............................... | 365/158 |
| 6,768,152 B2 | 7/2004 | Higo | | |
| 7,405,962 B2 * | 7/2008 | Kajiyama | ...................... | 365/158 |
| 7,920,355 B2 * | 4/2011 | Sakai | ........................ | 360/77.08 |
| 2007/0230053 A1 * | 10/2007 | Kong et al. | .................... | 360/131 |
| 2010/0013035 A1 * | 1/2010 | Ruehrig et al. | ................ | 257/427 |
| 2010/0080522 A1 | 4/2010 | Nguyen | | |
| 2010/0238718 A1 * | 9/2010 | Asao | .............................. | 365/158 |
| 2011/0020998 A1 * | 1/2011 | Oh et al. | ........................ | 438/381 |
| 2011/0227179 A1 * | 9/2011 | Kitagawa et al. | ............. | 257/421 |

FOREIGN PATENT DOCUMENTS

| | | |
|---|---|---|
| JP | 2003-243744 | 8/2003 |
| JP | 2004-193595 | 7/2004 |
| JP | 2010-080649 | 4/2010 |
| JP | 2010-080746 | 4/2010 |

OTHER PUBLICATIONS

Chen, et al. Study of dielectric breakdown distributions in magnetic tunneling junction with MgO barrier. *J. Appl. Phys.*, 105, 07C931 (2009); doi: 10.1063/1.3074508.

* cited by examiner

*Primary Examiner* — Jarrett Stark
*Assistant Examiner* — Shahed Ahmed
(74) *Attorney, Agent, or Firm* — Knobbe, Martens, Olson & Bear, LLP

(57) ABSTRACT

According to one embodiment, a magnetic random access memory includes a plurality of magnetoresistance elements. The plurality of magnetoresistance elements each include a recording layer having magnetic anisotropy perpendicular to a film surface, and a variable magnetization direction, a reference layer having magnetic anisotropy perpendicular to a film surface, and an invariable magnetization direction, and a first nonmagnetic layer formed between the recording layer and the reference layer. The recording layer is physically separated for each of the plurality of magnetoresistance elements. The reference layer and the first nonmagnetic layer continuously extend over the plurality of magnetoresistance elements.

10 Claims, 12 Drawing Sheets

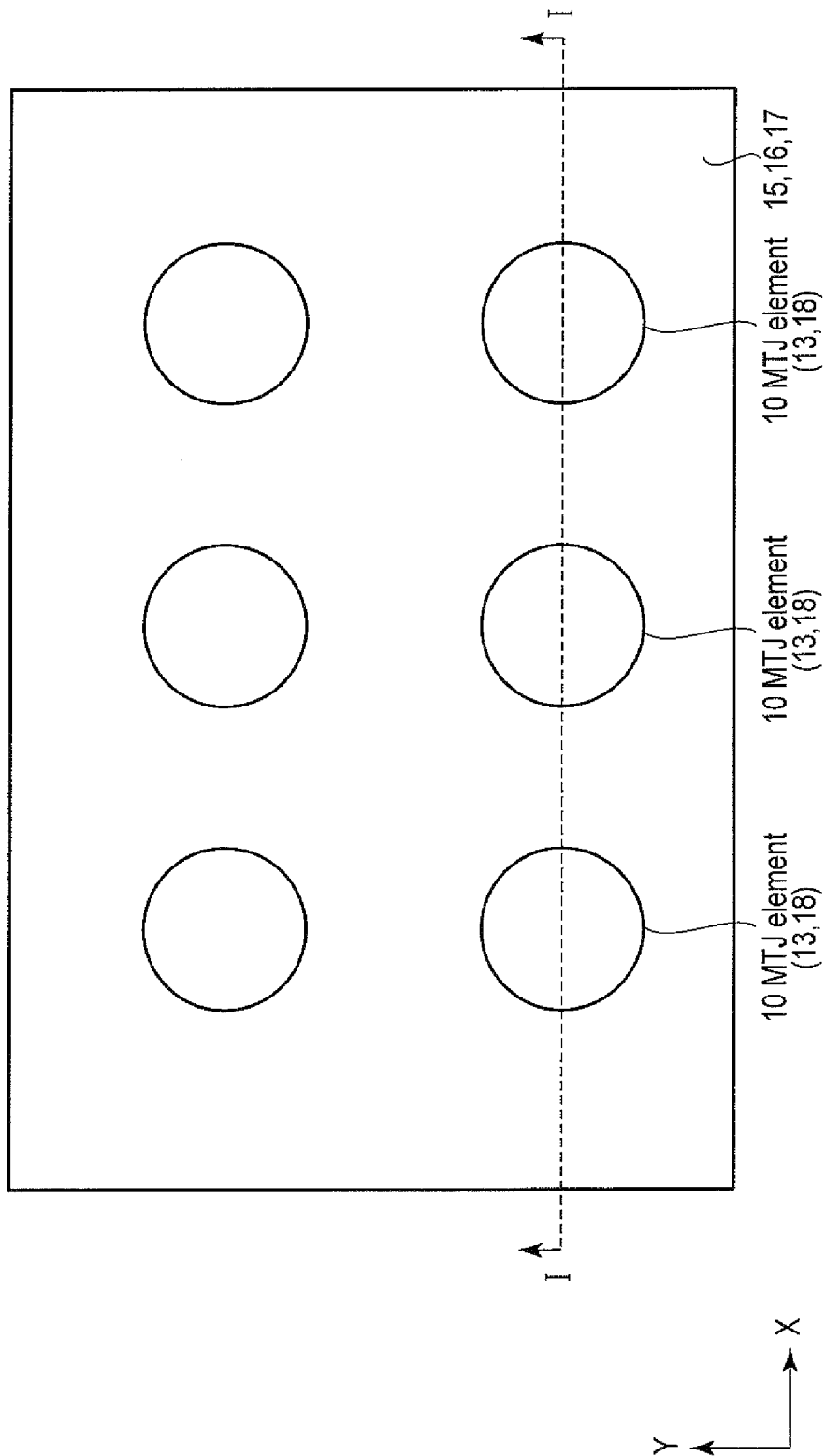

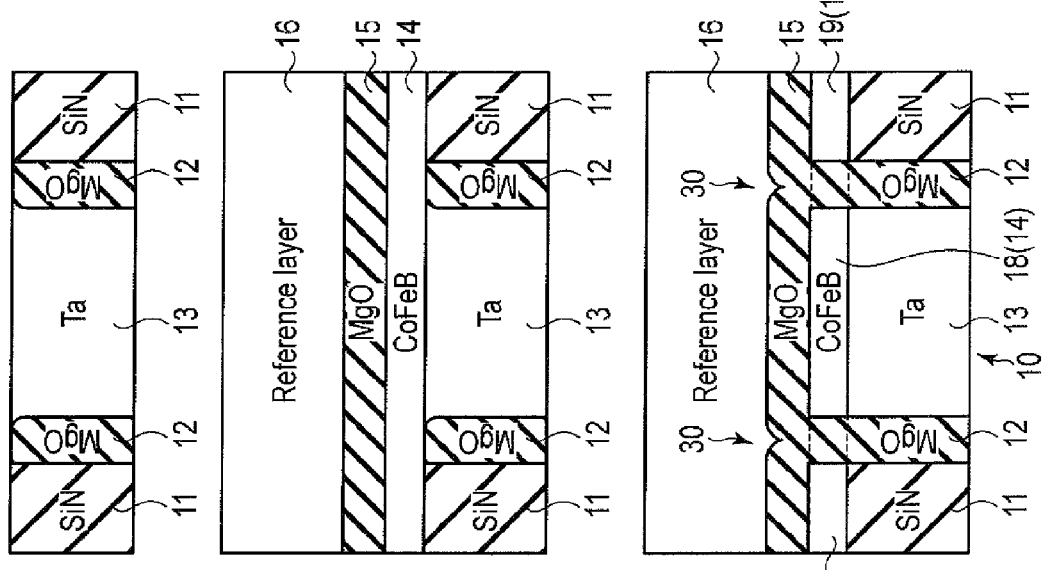
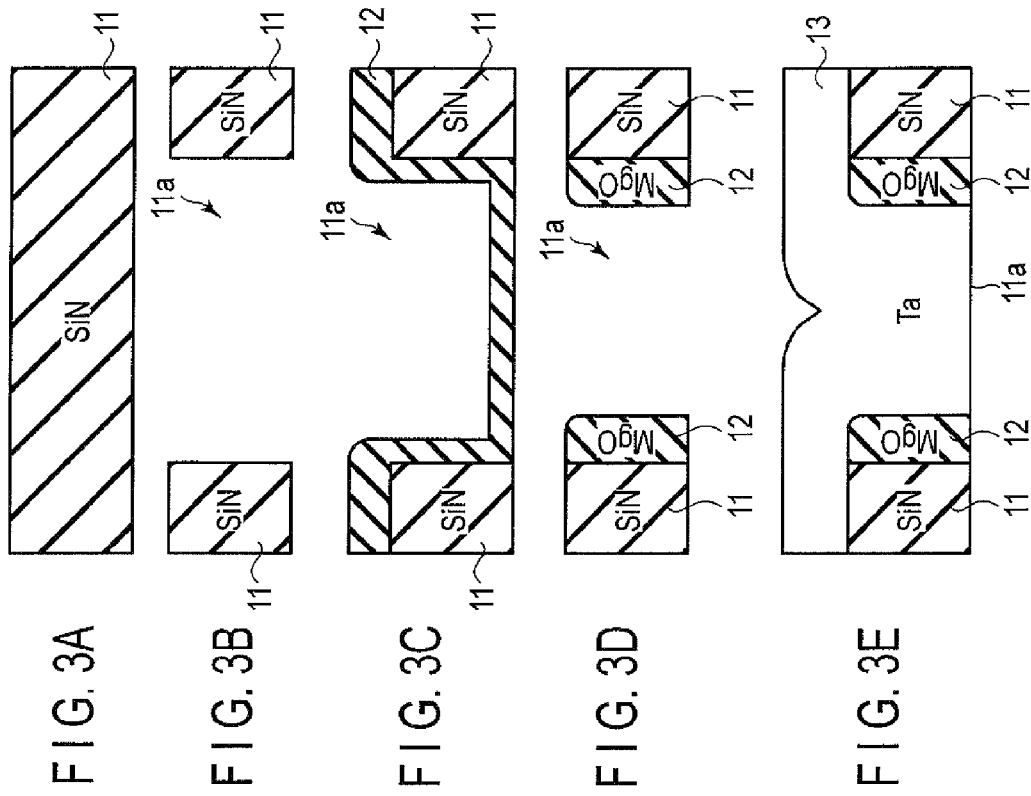

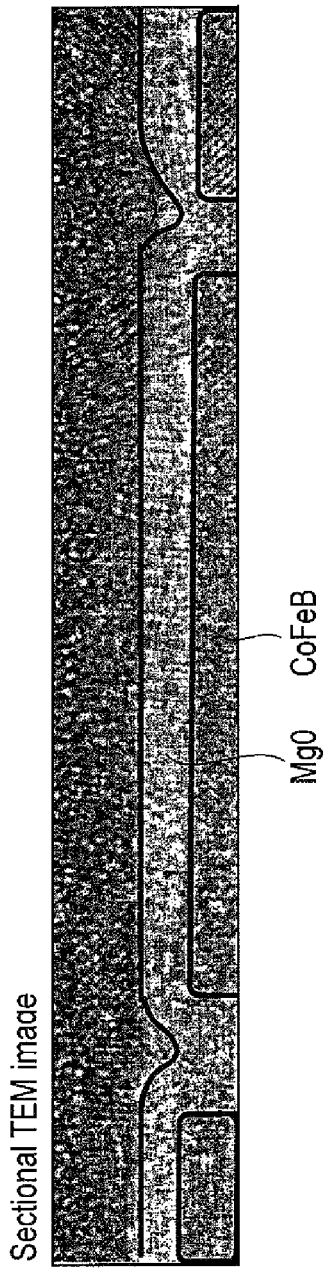
F I G. 4

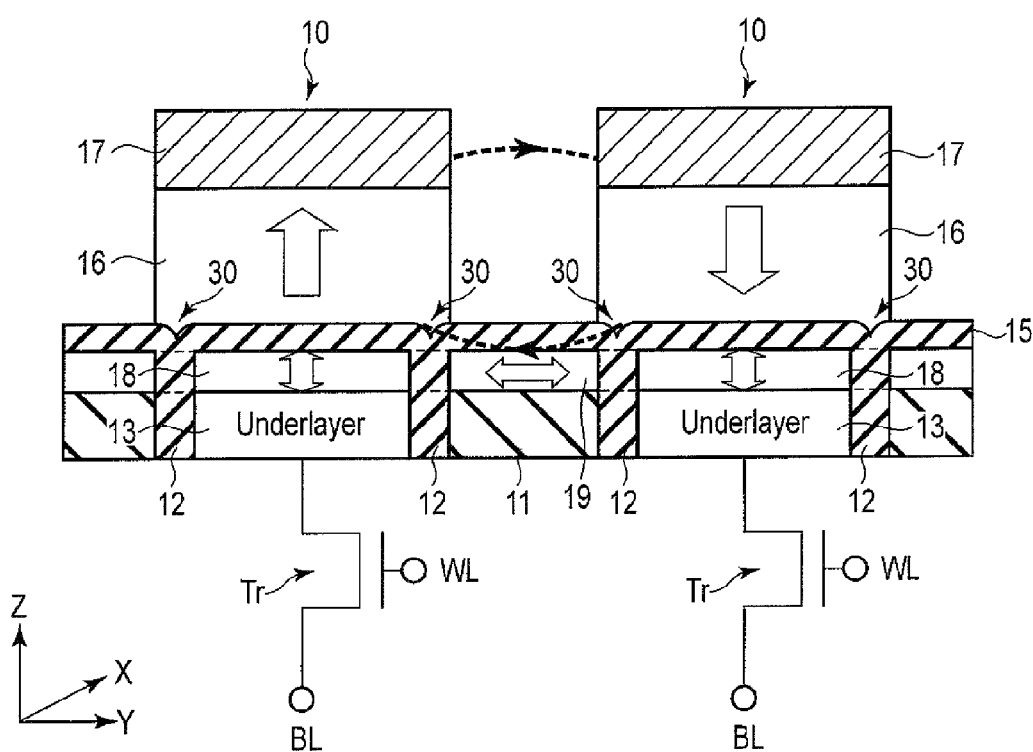
F I G. 9

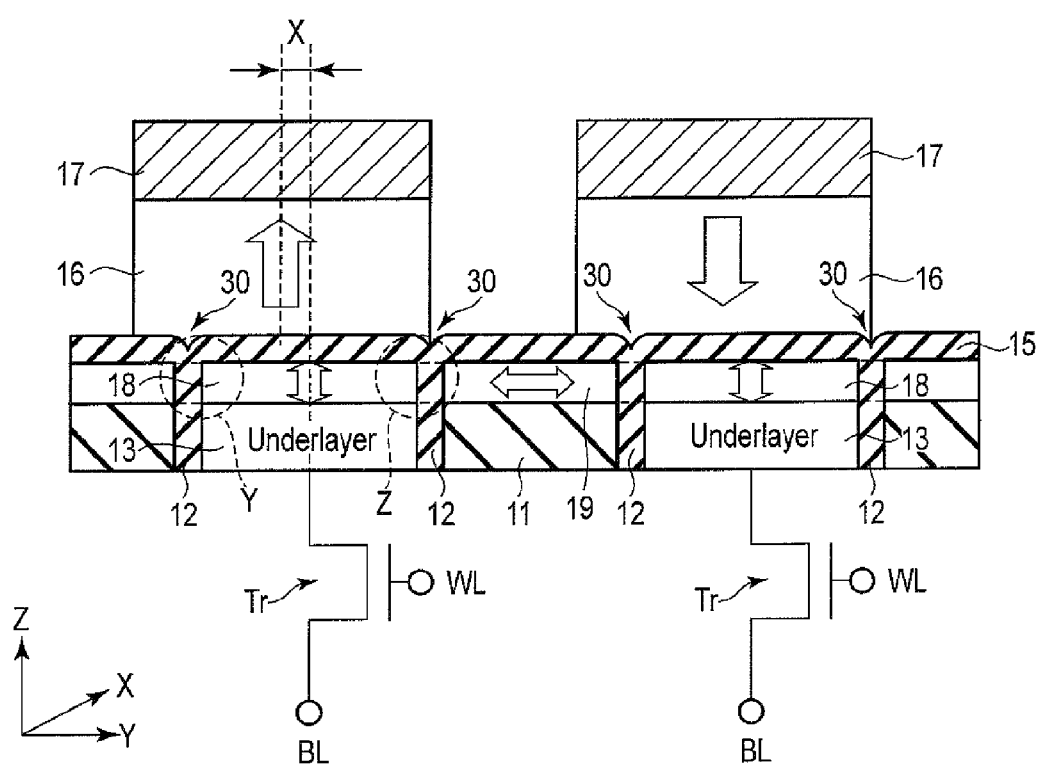
F I G. 10

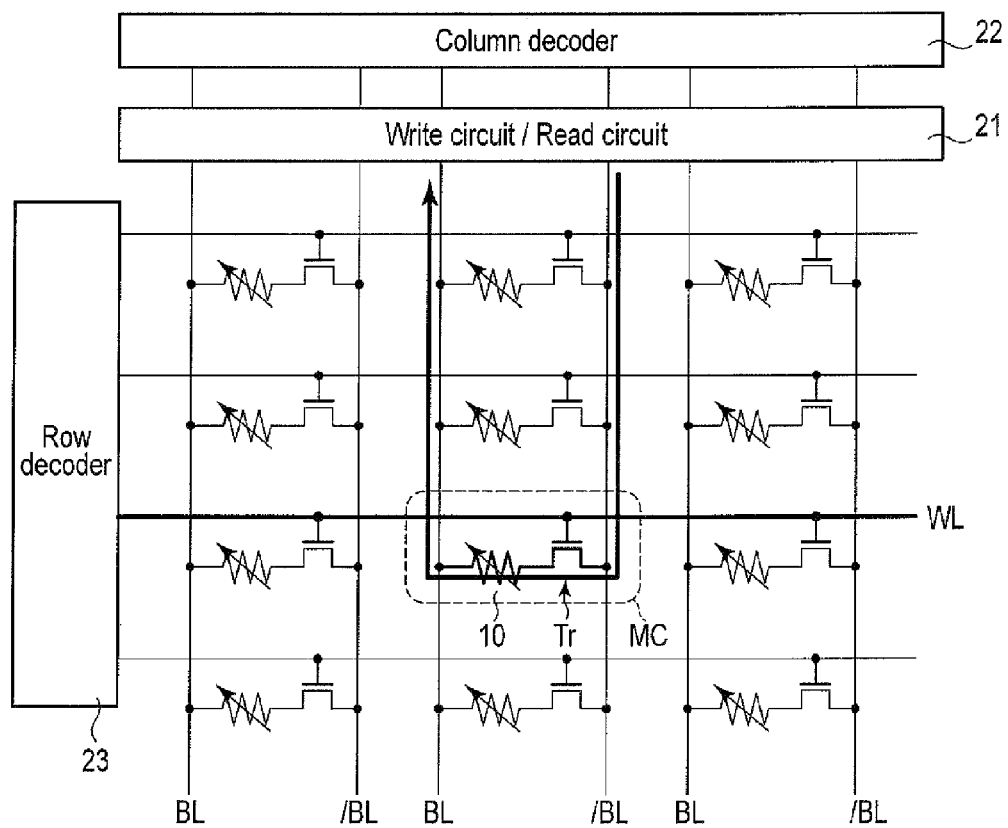
F I G. 12

MAGNETIC RANDOM ACCESS MEMORY

CROSS-REFERENCE TO RELATED APPLICATIONS

This application is based upon and claims the benefit of priority from prior Japanese Patent Application No. 2011-176687, filed Aug. 12, 2011, the entire contents of which are incorporated herein by reference.

FIELD

Embodiments described herein relate generally to a magnetic random access memory.

BACKGROUND

A spin transfer torque MRAM (Magnetic Random Access Memory) using a perpendicular magnetization film as a recording layer is advantageous in reducing a write current and increasing the capacity. A magnetic stray field generated from a reference layer is generally larger in a perpendicular magnetization type MTJ element than in an in-plane magnetization type MTJ element. Also, the recording layer having a coercive force smaller than that of the reference layer is strongly affected by the magnetic stray field from the reference layer. More specifically, the thermal stability decreases under the influence of the magnetic stray field from the reference layer.

As a means for reducing the magnetic stray field from the reference layer, which affects the recording layer in the perpendicular magnetization type MTJ element, a structure including a field canceling layer having magnetization in a direction opposite to that in the reference layer, a dual-pin structure, and the like have been proposed. When the element size decreases, however, the influence of the variation in element size on a write current increases. That is, if the element size varies, the magnetic stray field cannot be decreased to zero any longer, and the variation in magnetic stray field increases the variation in write current.

Also, in an MTJ element, the resistance value of a tunnel insulating film about 1 nm thick is read out. This tunnel insulating film is very thin. This poses the problem that, e.g., the sidewall of the tunnel insulating film is damaged when processing the MTJ element, redeposition of a metal occurs and causes insulation breakdown, or the reliability of the tunnel insulating film deteriorates and increases the variation in read current.

BRIEF DESCRIPTION OF THE DRAWINGS

FIG. 2 is a plan view showing memory cells of the magnetic random access memory according to the first embodiment;

FIGS. 3A, 3B, 3C, 3D, 3E, 3F, 3G, and 3H are sectional views showing manufacturing steps (Example 1) of an MTJ element according to the first embodiment;

FIG. 4 is a view showing a sectional TEM image of the MTJ element according to the first embodiment;

FIG. 9 is a sectional view taken along a line IX-IX in FIG. 8, which schematically shows the memory cells of the magnetic random access memory according to the second embodiment;

FIG. 10 is a schematic sectional view showing memory cells of a magnetic random access memory according to the third embodiment;

FIG. 12 is a view showing a memory cell array of the magnetic random access memory according to the fourth embodiment.

DETAILED DESCRIPTION

Figure 1:
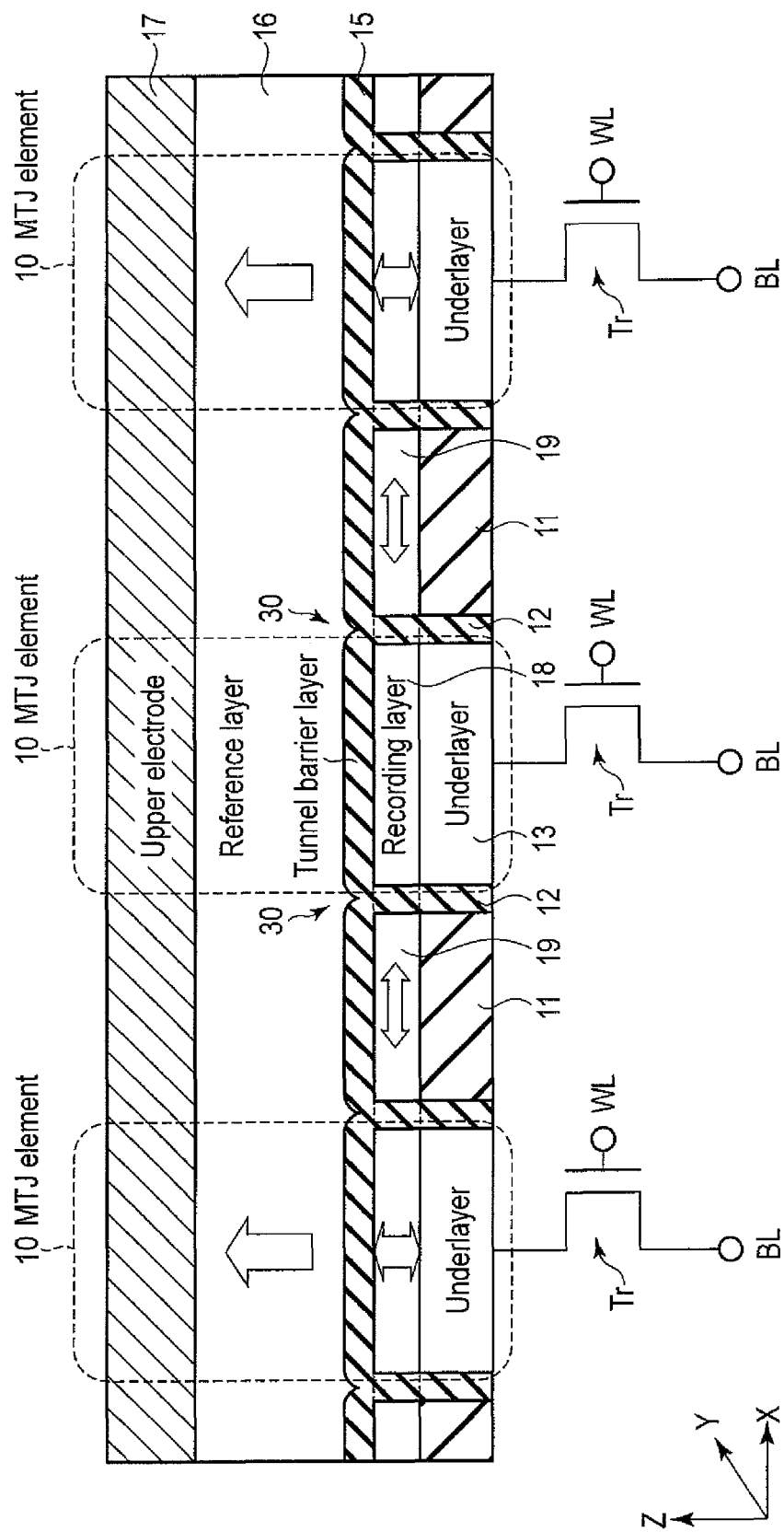
FIG. 1 is a schematic sectional view showing the structure of a memory cell of a magnetic random access memory according to the first embodiment.

In general, according to one embodiment, a magnetic random access memory includes a plurality of magnetoresistance elements each including a recording layer having magnetic anisotropy perpendicular to a film surface, and a variable magnetization direction, a reference layer having magnetic anisotropy perpendicular to a film surface, and an invariable magnetization direction, and a first nonmagnetic layer formed between the recording layer and the reference layer, wherein the recording layer is physically separated for each of the plurality of magnetoresistance elements, and the reference layer and the first nonmagnetic layer continuously extend over the plurality of magnetoresistance elements.

Embodiments will be explained below with reference to the accompanying drawings. Note that these drawings are exemplary or conceptual views, so the dimensions, ratios, and the like of each drawing are not necessarily the same as real ones. Note also that even the same portion may have different dimensional relationships and different ratios when shown in different drawings. In particular, several embodiments to be disclosed below are examples of a magnetic memory for embodying the technical idea of the present embodiment, so the technical idea of the present embodiment is not specified by the shapes, structures, layouts, and the like of components. Note that in the following explanation, the same reference numerals denote elements having the same functions and arrangements, and a repetitive explanation will be made only when necessary.

[1] First Embodiment

[1-1] Structure of Memory Cell

The structure of a memory cell of a magnetic random access memory (MRAM) according to the first embodiment will be explained below with reference to FIGS. 1 and 2. In this embodiment, a spin transfer torque MRAM capable of recording information by bidirectionally supplying electric currents will be taken as an example.

FIG. 1 is a sectional view of memory cells of the MRAM. FIG. 2 is a plan view of the memory cells of the MRAM. FIG. 1 is a sectional view taken along a line I-I in FIG. 2.

As shown in FIG. 1, an MTJ element 10 as a magnetoresistance element has a multilayered structure in which an underlayer 13, recording layer (storage layer or free layer) 18, tunnel barrier layer 15, reference layer (fixed layer) 16, and upper electrode 17 are stacked in this order. The MTJ element 10 having this structure is a memory element that stores information by using relative magnetization directions of two magnetic materials (the reference layer 16 and recording layer 18). Arrows in FIG. 1 indicate the magnetization directions. Note that this embodiment has an arrangement in which the underlayer 13 also functions as a lower electrode as one layer, but it is of course also possible to separately stack the underlayer 13 and a lower electrode.

A bit line BL (a write wiring/read wiring) is electrically connected to one terminal of the MTJ element 10 via a selection transistor Tr. The gate of the selection transistor Tr is connected to a word line WL. A bit line (write wiring/read wiring) (not shown) is electrically connected to the other terminal of the MTJ element 10.

In this embodiment as described above, the recording layer 18 and underlayer 13 are physically separated for each of a plurality of MTJ elements 10, whereas the tunnel barrier layer 15, reference layer 16, and upper electrode 17 are not physically separated for each of the plurality of MTJ elements 10 but continuously extend over the plurality of MTJ elements 10. That is, each of the tunnel barrier layer 15, reference layer 16, and upper electrode 17 is a layer that continues in all directions in the X-Y plane. In other words, the tunnel layer 15, reference layer 16, and upper electrode 17 continuously extend over the plurality of MTJ elements 10 in a direction (X direction) in which the bit lines BL run and a direction (Y direction) in which the word lines WL run. Note that unlike the tunnel barrier layer 15 and reference layer 16, the upper electrode 17 need not always continuously extend over the plurality of MTJ elements 10 and may also physically be separated for each of the plurality of MTJ elements 10.

A sidewall layer 12 is formed on the circumferential surface of the underlayer 13. A nonmagnetic layer 11 is formed on the circumferential surface of the sidewall layer 12. For example, the nonmagnetic layer 11 and underlayer 13 have the same film thickness, i.e., their upper surfaces are leveled with each other, and their lower surfaces are leveled with each other. However, the present embodiment is not limited to this. The sidewall layer 12 is in contact with the tunnel barrier layer 15.

A magnetization absorbing layer 19 is formed on the nonmagnetic layer 11. The magnetization absorbing layer 19 functions as a layer for absorbing magnetic stray fields from the recording layer 18 and reference layer 16. The magnetization absorbing layer 19 is formed in the same plane as that of the recording layer 18. The magnetization absorbing layer 19 and recording layer 18 can have the same film thickness, i.e., their upper surfaces can be leveled with each other, and their lower surfaces can be leveled with each other. The magnetization absorbing layer 19 and recording layer 18 are made of the same material. However, the recording layer 18 has magnetic anisotropy in a direction perpendicular to the film surface, whereas the magnetization absorbing layer 19 has magnetic anisotropy in a direction parallel to the film surface. The directions of magnetic anisotropy in the recording layer 18 and magnetization absorbing layer 19 are controlled by the materials of the underlayer 13 and nonmagnetic layer 11 respectively in contact with the recording layer 18 and magnetization absorbing layer 19. This point will be described later. The magnetization absorbing layer 19 is formed between adjacent recording layers 18, and electrically isolated from the recording layers 18 and selection transistors Tr.

The sidewall layer 12 or tunnel barrier layer 15 is formed between the magnetization absorbing layer 19 and recording layer 18. That is, the magnetization absorbing layer 19 and recording layer 18 are electrically isolated by the sidewall layer 12 or tunnel barrier layer 15. Note that a layer formed in tight contact with the sidewall layer 12 and tunnel barrier layer 15 by a manufacturing method (to be described later) exists between the magnetization absorbing layer 19 and recording layer 18. This layer between the magnetization absorbing layer 19 and recording layer 18 is made of the sidewall layer 12, the tunnel barrier layer 15, or both the sidewall layer 12 and tunnel barrier layer 15, depending on the annealing conditions, materials, and the like in the manufacturing process.

The upper surface of the tunnel barrier layer 15 has a concave portion 30 above the sidewall layer 12. The concave portion 30 is formed because the tunnel barrier layer 15 is formed downward in tight contact with the sidewall layer 12 by the manufacturing method (to be described later).

This embodiment is a so-called, bottom-free structure (top-pinned structure) in which the recording layer 18 is formed between the tunnel barrier layer 15 and selection transistor Tr. However, it is also possible to adopt a so-called, top-free structure (bottom-pinned structure) in which the reference layer 16 is formed between the tunnel barrier layer 15 and selection transistor Tr.

As shown in FIG. 2, a plurality of recording layers 18 and a plurality of underlayers 13 share the tunnel barrier layer 15, reference layer 16, and upper electrode 17. That is, while the recording layer 18 and underlayer 13 are physically separated for each MTJ element 10, the tunnel barrier layer 15, reference layer 16, and upper electrode 17 continuously extend over a plurality of MTJ elements 10.

[1-2] Materials of MTJ Element 10

The recording layer 18 and reference layer 16 are made of ferromagnetic materials, and have magnetic anisotropy in the direction perpendicular to the film surface. The directions of easy magnetization in the recording layer 18 and reference layer 16 are perpendicular to the film surface. That is, the MTJ element 10 is a perpendicular magnetization MTJ element in which the magnetization directions in the recording layer 18 and reference layer 16 are perpendicular to the film surfaces. Note that the direction of easy magnetization is a direction in which the internal energy of a ferromagnetic material having a given macro size becomes lowest if spontaneous magnetization points in that direction with no external magnetic field. On the other hand, the direction of hard magnetization is a direction in which the internal energy of a ferromagnetic material having a given macro size becomes highest if spontaneous magnetization points in that direction with no external magnetic field.

In the recording layer 18, the magnetization (or spin) direction is variable (reverses) by the action of spin-polarized electrons. In the reference layer 16, the magnetization direction is invariable (fixed). The reference layer 16 is set to have a perpendicular magnetic anisotropic energy much larger than that of the recording layer 18. The magnetic anisotropy can be set by adjusting the material arrangement or film thickness. Thus, a magnetization reversing current of the recording layer 18 is decreased, thereby making a magnetization reversing current of the reference layer 16 larger than that of the recording layer 18. This makes it possible to implement the MTJ element 10 including the recording layer 18 having a variable magnetization direction and the reference layer 16 having an invariable magnetization direction, with respect to a predetermined write current.

The recording layer 18 can be made of, e.g., Fe, FeB, CoFe, or CoFeB. When using CoFe or CoFeB, the concentration of Fe is desirably higher than that of Co because the perpendicular magnetic anisotropy of the recording layer 18 can be improved. Note that the magnetization absorbing layer 19 is made of the same material as that of the recording layer 18 as described above.

As the reference layer 16, it is possible to use a Co/Pt artificial lattice, a Co/Pd artificial lattice, an hcp alloy such as CoPt, CoCrPt, or CoPd, an RE-TM ferrimagnetic material such as TbCoFe or DyCoFe, or an Mn-based alloy such as MnAl, MnBi, or MnGa. This makes it possible to form a perpendicular magnetization film. Note that a high MR can be obtained by sandwiching CoFeB between this perpendicular magnetization film and the tunnel barrier layer 15.

The tunnel barrier layer 15 is an insulator made of a nonmagnetic material such as MgO, MgAlO, or AlO.

The underlayer 13 has a function of improving the magnetic anisotropy of the recording layer 18. The recording layer 18 can be given perpendicular magnetic anisotropy by appropriately selecting the materials of the underlayer 13 and recording layer 18. For example, a material containing at least one element selected from Ta, Y, La, Ti, Zr, Hf, Mo., W, Ru, Ir, Pd, Pt, and Al is used as the underlayer 13. Consequently, the perpendicular magnetic anisotropy of the recording layer 18 can be improved.

The sidewall layer 12 is an insulator of a nonmagnetic material, i.e., made of an oxide containing at least one element selected from Mg, Al, and Si. For example, the sidewall layer 12 is made of MgO, MgAlO, AlO, SiON, or SiO.

The nonmagnetic layer 11 is desirably formed by a material with which the magnetization absorbing layer 19 becomes an in-plane magnetization film. The nonmagnetic layer 11 is made of a nitride or oxide containing Si. For example, the nonmagnetic layer 11 is made of SiN or SiO.

[1-3] Manufacturing Method

Example 1 of a method of manufacturing the MTJ element according to the first embodiment will be explained below with reference to FIGS. 3A, 3B, 3C, 3D, 3E, 3F, 3G, and 3H.

First, as shown in FIG. 3A, a contact electrode (not shown) to be connected to a selection transistor (not shown) is formed, and a nonmagnetic layer 11 made of, e.g., SiN is deposited on the contact electrode.

Then, as shown in FIG. 3B, a via 11a is formed in the nonmagnetic layer 11 by using lithography and etching.

As shown in FIG. 3C, a sidewall layer 12 made of, e.g., MgO is deposited in the via 11a and on the nonmagnetic layer 11.

As shown in FIG. 3D, the sidewall layer 12 on the bottom surface of the via 11a and on the nonmagnetic layer 11 is removed by using bias etching or the like. Consequently, the sidewall layer 12 remains on only the circumferential surface of the via 11a (the nonmagnetic layer 11).

As shown in FIG. 3E, an underlayer 13 made of, e.g., Ta is deposited in the via 11a and on the sidewall layer 12 and nonmagnetic layer 11.

As shown in FIG. 3F, the underlayer 13 is planarized by using CMP or the like, thereby exposing the surfaces of the sidewall layer 12 and nonmagnetic layer 11.

As shown in FIG. 3G, a magnetic layer 14 made of, e.g., CoFeB (1 nm), a tunnel barrier layer 15 made of, e.g., MgO (1 nm), and a reference layer 16 are sequentially deposited on the underlayer 13, sidewall layer 12, and nonmagnetic layer 11.

As shown in FIG. 3H, annealing is performed in, e.g., a vacuum at a temperature of 350° C. for 1 hr, thereby adhering MgO of the sidewall layer 12 and MgO of the tunnel barrier layer 15. This separates the magnetic layer 14 on the underlayer 13 from the magnetic layer 14 on the nonmagnetic layer 11. As a consequence, recording layers 18 separated for each MTJ element 10 are formed, and a magnetization absorbing layer 19 made of the same material as that of the recording layer 18 remains on the nonmagnetic layer 11. Also, a concave portion 30 is formed in the surface of the tunnel barrier layer 15 above the sidewall layer 12.

Note that as can be seen from a sectional TEM (Transmission Electron Microscope) image shown in FIG. 4, annealing connects MgO (the sidewall layer 12) and MgO (the tunnel barrier layer 15), and divides CoFeB (the magnetic layer 14). In addition, the concave portion 30 is formed in the upper surface of MgO (the tunnel barrier layer 15) above MgO (the sidewall layer 12).

Next, Example 2 of the method of manufacturing the MTJ element according to the first embodiment will be explained with reference to FIGS. 5A, 5B, 5C, 5D, 5E, 5F, and 5G. While MgO is used as the sidewall layer 12 in Example 1, SiON is used in Example 2. In Example 2, differences from above-described Example 1 will mainly be explained.

Figure 5E:
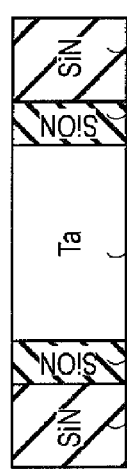
FIGS. 5A, 5B, 5C, 5D, 5E, 5F, and 5G are sectional views showing manufacturing steps (Example 2) of the MTJ element according to the first embodiment.
Figure 5F:
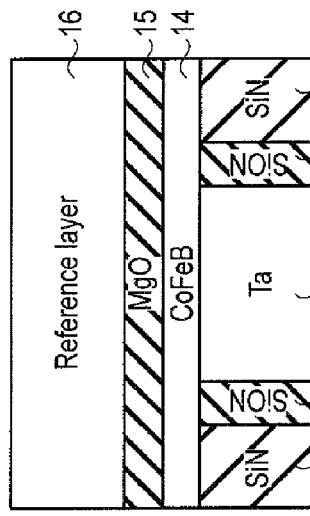
Figure 5G:
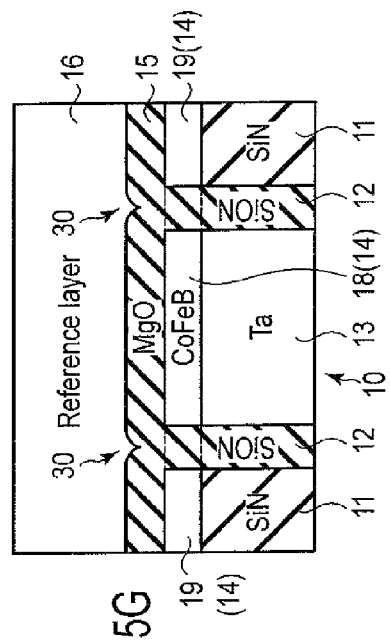
Figure 5A:
Figure 5B:
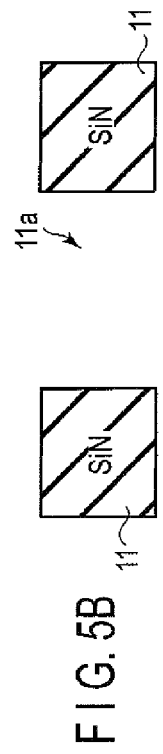

As shown in FIGS. 5A and 5B, a via 11a is formed in a nonmagnetic layer 11 made of, e.g., SiN.

Figure 5C:
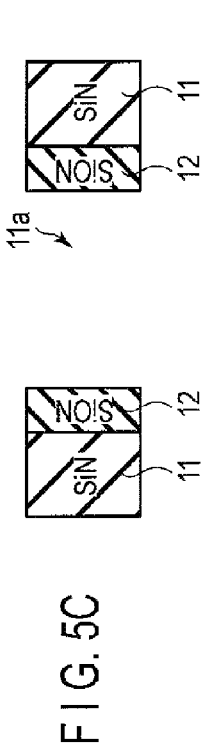

Then, as shown in FIG. 5C, a sidewall 12 made of SiON is formed on the circumferential surface of the via 11a (the nonmagnetic layer 11) by oxidizing the nonmagnetic layer 11 made of SiN. Note that SiON formed on the nonmagnetic layer 11 and the like is removed.

Figure 5D:
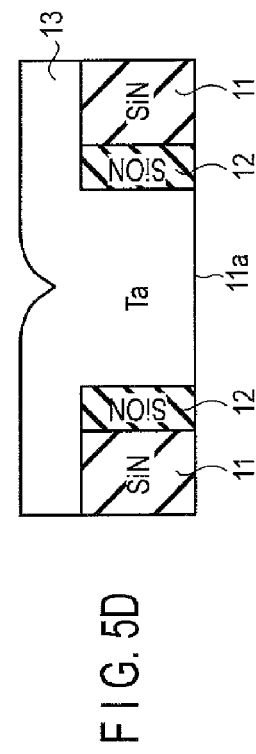

As shown in FIGS. 5D, 5E, and 5F, as in Example 1, a magnetic layer 14 made of, e.g., CoFeB (1 nm), a tunnel barrier layer 15 made of, e.g., MgO (1 nm), and a reference layer 16 are sequentially deposited on the underlayer 13, sidewall layer 12, and nonmagnetic layer 11.

As shown in FIG. 5G, annealing is performed in, e.g., a vacuum at a temperature of 350° C. for 1 hr, thereby adhering SiON of the sidewall layer 12 and MgO of the tunnel barrier layer 15. This separates the magnetic layer 14 on the underlayer 13 from the magnetic layer 14 on the nonmagnetic layer 11. As a consequence, recording layers 18 separated for each MTJ element 10 are formed, and a magnetization absorbing layer 19 made of the same material as that of the recording layer 18 remains on the nonmagnetic layer 11. Also, a concave portion 30 is formed in the surface of the tunnel barrier layer 15 above the sidewall layer 12.

[1-4] Magnetic Characteristics of Recording Layer 18 and Magnetization Absorbing Layer 19

The magnetic characteristics of the recording layer 18 and magnetization absorbing layer 19 formed by the manufacturing method as described above will be explained below with reference to FIGS. 6 and 7.

Figure 6:
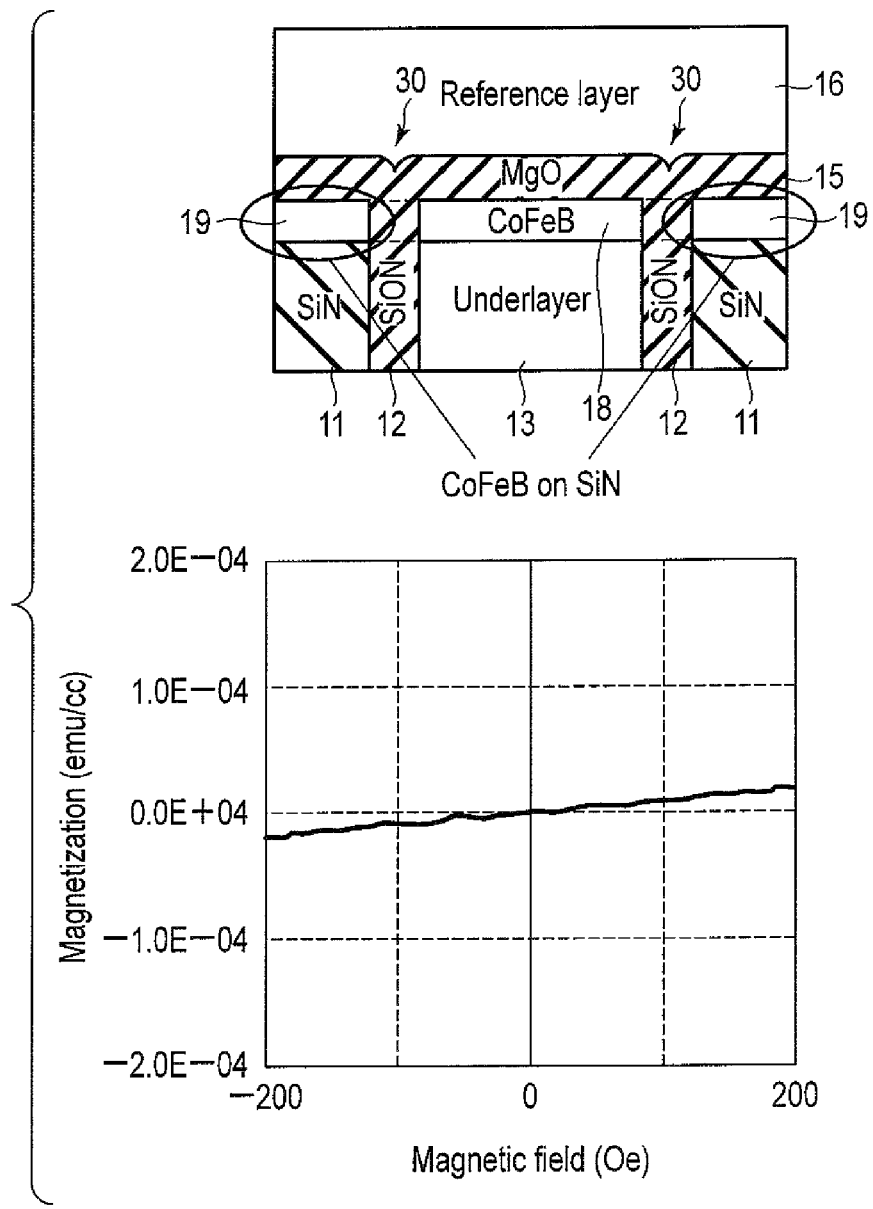
FIG. 6 is a view showing the magnetic characteristic of CoFeB on SiN in the MTJ element according to the first embodiment.

FIG. 6 shows the magnetic characteristic of CoFeB (the magnetization absorbing layer 19) on SiN (the nonmagnetic layer 11). FIG. 7 shows the magnetic characteristic of CoFeB (the recording layer 18) on Ta (the underlayer 13). Referring to FIGS. 6 and 7, the abscissa indicates the magnitude (Oe) of a magnetic field when it is applied perpendicularly to the in-plane direction of the film (a film surface perpendicular direction), and the ordinate indicates the magnitude (emu/cc) of magnetization in the film surface perpendicular direction. Note that "E" in FIGS. 6 and 7 means an exponential function having 10 as the base.

As indicated by the magnetic characteristic shown in FIG. 6, CoFeB (the magnetization absorbing layer 19) on SiN (the nonmagnetic layer 11) is an in-plane magnetization film in which anisotropy in the in-plane direction is higher than that in the perpendicular direction.

Figure 7:
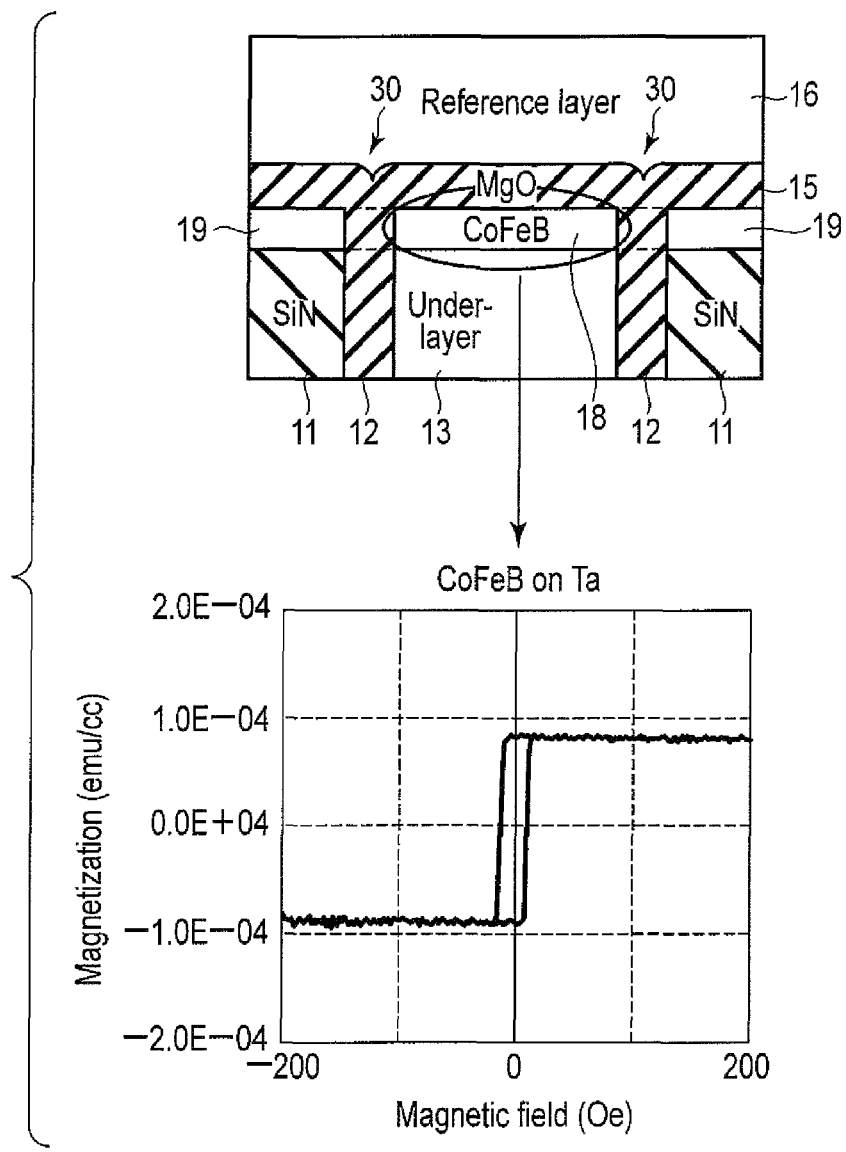
FIG. 7 is a view showing the magnetic characteristic of CoFeB on W or Ta in the MTJ element according to the first embodiment.

On the other hand, as indicated by the magnetic characteristic shown in FIG. 7, CoFeB (the recording layer 18) on Ta (the underlayer 13) is a perpendicular magnetization film.

In this embodiment as described above, the underlayer 13 below the recording layer 18 is preferably made of a material by which the recording layer 18 becomes a perpendicular magnetization film, and the nonmagnetic layer 11 below the magnetization absorbing layer 19 is preferably made of a material by which the magnetization absorbing layer 19 becomes an in-plane magnetization film.

[1-5] Effects

In the first embodiment, the reference layer 16 is not divided for each cell but is continuously formed over a plurality of MTJ elements 10. A magnetic stray field is almost zero in a structure in which the reference layer 16 is not completely divided as described above. When a magnetic stray field from the reference layer 16 is zero, a shift in magnetization reversing magnetic field in the recording layer 18 is zero. Since this obviates the need for a shift adjusting layer, the manufacturing cost can be reduced. In addition, the reduction in magnetic stray field reduces magnetic stray field variations caused by variations in size of the MTJ elements 10. This makes it possible to reduce the thermal disturbance resistance and write current of the MTJ element 10.

Also, in the first embodiment, the tunnel barrier layer 15 is not divided for each cell but is continuously formed over a plurality of MTJ elements 10. This eliminates redeposition of metal particles on the sidewall of the tunnel barrier layer 15 and processing damage to the tunnel barrier layer 15 when processing the tunnel barrier layer 15. Accordingly, it is possible to prevent insulation failures of the tunnel barrier layer 15, and reduce variations in read current.

Furthermore, in the first embodiment, the magnetization absorbing layer 19 having magnetic anisotropy in the in-plane direction is formed between adjacent MTJ elements 10. Since the magnetization absorbing layer 19 absorbs magnetic stray fields from the recording layer 18 and reference layer 16, the magnetic stray fields from the recording layer 18 and reference layer 16 can further be reduced.

[2] Second Embodiment

The second embodiment adopts a structure in which a reference layer 16 is linearly separated.

[2-1] Structure of Memory Cell

The structure of a memory cell of an MRAM according to the second embodiment will be explained below with reference to FIGS. 8 and 9.

Figure 8:
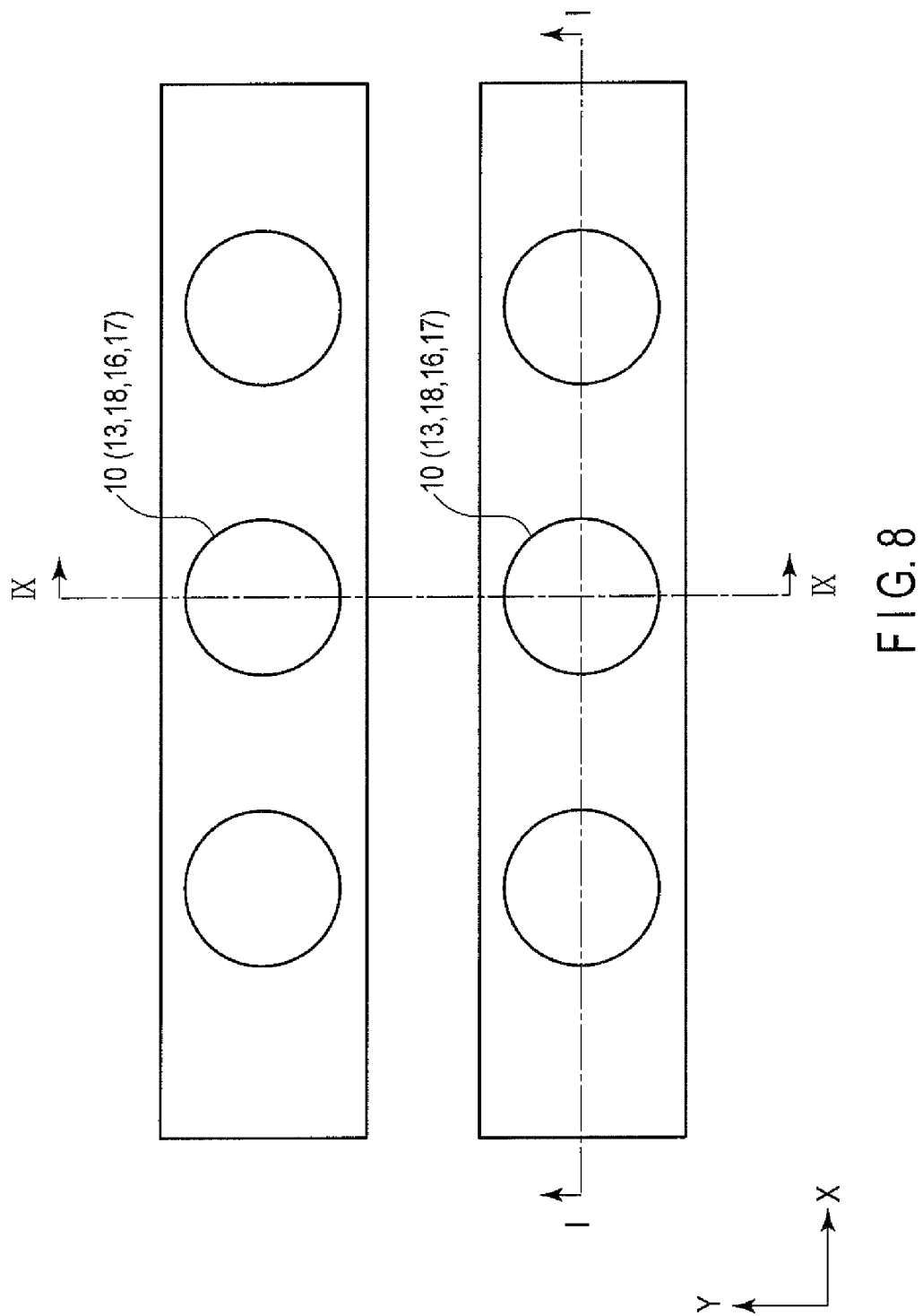
FIG. 8 is a plan view showing memory cells of a magnetic random access memory according to the second embodiment.

FIG. 8 is a plan view of memory cells of the MRAM. FIG. 9 is a sectional view taken along a line IX-IX in FIG. 8. Note that a sectional view taken along a line I-I in FIG. 8 is FIG. 1.

As shown in FIGS. 8 and 9, the second embodiment differs from the first embodiment in that the reference layer 16 and an upper electrode 17 are linearly separated.

More specifically, in a direction (Y direction) in which word lines WL run, the reference layer 16 and upper electrode 17 are separated for at least each MTJ element 10 of a plurality of MTJ elements 10. When linearly separating the reference layer 16 and upper electrode 17, a magnetic stray field can further be reduced by separating them for every plurality of columns (e.g., two to five columns). Note that in a direction (X direction) in which bit lines BL run, the reference layer 16 and upper electrode 17 continuously extend over a plurality of MTJ elements 10, as in the first embodiment.

Magnetization directions in adjacent separated reference layers 16 are desirably antiparallel to each other. The magnetization directions in adjacent reference layers 16 are made antiparallel by self-formation by heating the MTJ elements 10 to a temperature equal to or higher than the Curie temperature of the reference layer 16 and cooling the MTJ elements 10, after the reference layer 16 is cut or the MRAM is manufactured. Whether the magnetization directions in adjacent separated reference layers 16 are antiparallel to each other can be analyzed by using, e.g., an MFM (Magnetic Force Microscope).

When separating the reference layer 16, the following structure in which the end portion of the reference layer 16 comes closer to a magnetization absorbing layer 19 is desirable. This is to allow the magnetization absorbing layer 19 to more absorb a magnetic stray field from the end portion of the reference layer 16.

For example, the width of the reference layer 16 in the Y direction is preferably larger than that of the recording layer 18 in the Y direction, and more preferably larger than the total width of the width of the recording layer 18 in the Y direction and the widths of sidewall layers 12 on the two side surfaces of the recording layer 18. In other words, the distance between adjacent separated reference layers 16 is preferably shorter than the width of the magnetization absorbing layer 19 in the Y direction. The side surface of the reference layer 16 desirably protrudes outside more than the side surface of the sidewall layer 12 on the side of the magnetization absorbing layer 19. A concave portion 30 desirably exists below the bottom surface of the reference layer 16.

Note that in the second embodiment, the linear reference layers 16 need not extend in the direction (X direction) in which the bit lines BL run, and may also extend in the direction (Y direction) in which the word lines WL run.

[2-2] Effects

In the above-mentioned second embodiment, a tunnel barrier layer 15 is not separated. When processing the tunnel barrier layer 15, therefore, no redeposition of metal particles occurs on the sidewall of the tunnel barrier layer 15, and no processing damage is inflicted. This makes it possible to prevent an insulation failure of the tunnel barrier layer 15, and reduce the variation in read current.

Also, in the second embodiment, the reference layer 16 is linearly separated but continuously extends over a plurality of MTJ elements 10 in the direction (X direction) in which the bit lines BL run as in the first embodiment. Accordingly, a magnetic stray field can be reduced in the direction (X direction) in which the bit lines BL run.

In the second embodiment, the magnetization directions in the linearly separated reference layers 16 are antiparallel to each other. Therefore, a magnetic stray field from the reference layers 16 can be reduced.

In the second embodiment, the reference layer 16 is separated for every column to every few columns. This makes it possible to suppress the generation of a sneak current when performing read or write to a plurality of bits at the same time.

Furthermore, in the second embodiment, the magnetization absorbing layer 19 having magnetic anisotropy in the in-plane direction is formed between adjacent MTJ elements 10 as in the first embodiment. Since the magnetization absorbing layer 19 absorbs magnetic stray fields from the recording layer 18 and reference layer 16, the magnetic stray fields from the recording layer 18 and reference layer 16 can further be reduced.

[3] Third Embodiment

The third embodiment is a modification of the second embodiment, and directed to a structure in which the center of each of linearly separated reference layers 16 is shifted from the center of a recording layer 18.

[3-1] Structure of Memory Cell

The structure of a memory cell of an MRAM according to the third embodiment will be explained below with reference to FIG. 10.

As shown in FIG. 10, the third embodiment differs from the second embodiment in that the center of each of the linearly separated reference layers 16 is shifted by a distance X from the center of the recording layer 18. The distance X desirably satisfies 0<X<(width of reference layer 16−width of recording layer 18)/2.

Note that both the two adjacent separated reference layers 16 are shifted to the left on the drawing surface of FIG. 10, but the present embodiment is not limited to this. The adjacent separated reference layers 16 may also be shifted closer to each other. For example, the reference layer 16 on the right side of the drawing surface may be shifted to the left on the drawing surface, and the reference layer 16 on the left side of the drawing surface may be shifted to the right on the drawing surface.

Furthermore, as shown in FIG. 10, one of the side surfaces of the reference layer 16 may also be positioned on a concave portion 30. This makes it possible to position the reference layer 16 closer to the recording layer 18, and apply a larger magnetic stray field to an end portion Z of the recording layer 18.

[3-2] Effects

The above-mentioned third embodiment can achieve the same effects as those of the second embodiment by linearly separating the reference layer 16.

In addition, in the third embodiment, the center of each of the linearly separated reference layers 16 is shifted by the distance X from the center of the recording layer 18. Accordingly, a magnetic stray field larger than that applied to an end portion Y of the recording layer 18 is applied to the end portion Z of the recording layer 18. Consequently, the thermal disturbance resistance of spins in the end portion Z of the recording layer 18 decreases, so spin transfer torque magnetization reversal can occur from the end portion Z. By controlling the spin transfer torque magnetization reversal in one direction, it is possible to control the precession of spins and shorten the write time.

[4] Fourth Embodiment

In the above-mentioned first embodiment as shown in FIG. 1, the reference layer 16 and upper electrode 17 are not separated for each cell. In this structure, a sneak current may be generated if read or write is performed for a plurality of bits at the same time.

In the fourth embodiment, therefore, a magnetic material having a perovskite structure aligned along the C axis with respect to the film surface is used as a reference layer 16 in a structure in which the reference layer 16 and an upper electrode 17 are not separated for each cell. For example, the fourth embodiment can be implemented by using, e.g., YBaCoO or SrYCoO having the perovskite structure as the reference layer 16.

[4-1] Structure of Memory Cell

The structure of a memory cell of an MRAM according to the fourth embodiment will be explained below with reference to FIG. 11.

Figure 11:
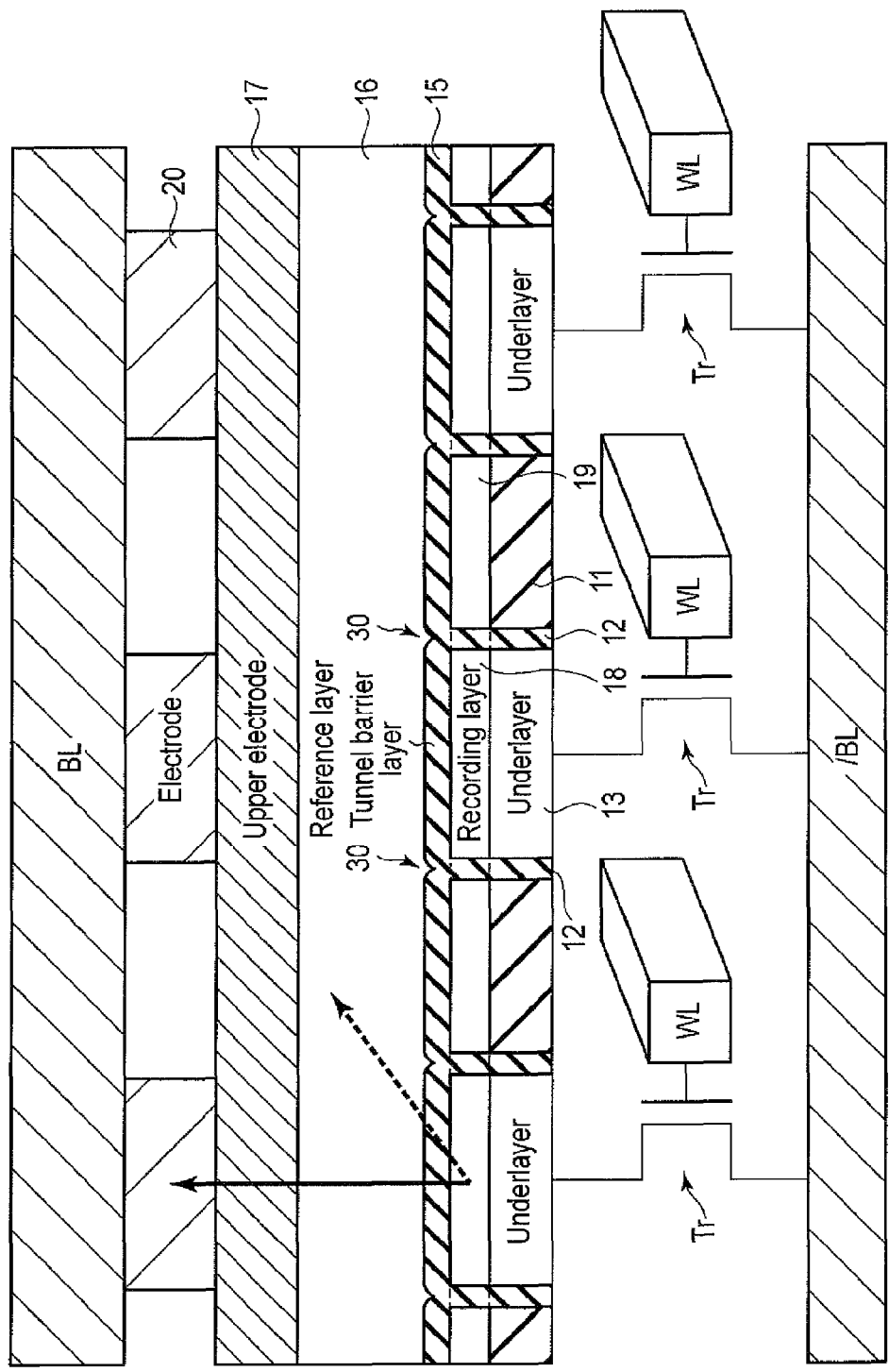
FIG. 11 is a schematic sectional view showing memory cells of a magnetic random access memory according to the fourth embodiment.

As shown in FIG. 11, the fourth embodiment differs from the first embodiment in that the reference layer 16 is made of a magnetic material having the perovskite structure in which an electric current flowing parallel to the film surface is smaller than that flowing perpendicularly to the film surface, and which is aligned perpendicularly to the film surface.

Selection transistors Tr are connected in one-to-one correspondence with MTJ elements 10, and word lines WL and bit lines/BL connected to the selection transistors Tr intersect each other. Also, bit lines BL connected to the MTJ elements 10 intersect the word lines WL. That is, since two bit lines/BL and BL intersect each word line WL, it is possible to perform random access and suppress a sneak current.

Note that FIG. 11 shows the structure in which the bit line BL, reference layer 16, and upper electrode 17 are connected by electrodes 20. However, it is also possible to omit the bit line BL and electrodes 20 and use the upper electrode 17 as the bit line BL.

Furthermore, the reference layer 16 in the above-described structure according to the fourth embodiment is applicable not only to the first embodiment but also to the second or third embodiment.

[4-2] Effects

The above-mentioned fourth embodiment can achieve the same effects as those of the first to third embodiments.

In addition, in the fourth embodiment, the reference layer 16 is made of a magnetic material having the perovskite structure in which an electric current flowing parallel to the film surface is smaller than that flowing perpendicularly to the film surface, and which is aligned perpendicularly to the film surface. That is, an electric current flows in the Z direction, and hardly flows in the X and Y directions. This makes random access possible by suppressing a sneak current (FIG. 12).

As described above, the magnetic random access memory of each of the above-described embodiments can reduce insulation failures of the tunnel barrier layer while reducing a magnetic stray field from the reference layer, which affects the recording layer.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic random access memory comprising a plurality of magnetoresistance elements each comprising:

a recording layer having magnetic anisotropy perpendicular to a film surface, and a variable magnetization direction;

a reference layer having magnetic anisotropy perpendicular to a film surface, and an invariable magnetization direction; and a first nonmagnetic layer formed between the recording layer and the reference layer, wherein the recording layer is physically separated for each of the plurality of magnetoresistance elements, and the reference layer and the first nonmagnetic layer continuously extend over the plurality of magnetoresistance elements;

a first magnetic layer formed in the same plane as that of the recording layer, and electrically isolated from the recording layer;

a second nonmagnetic layer formed on a surface of the recording layer, which is opposite to a surface on which the first nonmagnetic layer is formed;

a third nonmagnetic layer formed on sidewalls of the recording layer and the second nonmagnetic layer; and a fourth nonmagnetic layer formed on a sidewall of the third nonmagnetic layer, wherein the third nonmagnetic layer is in contact with the recording layer, the first magnetic layer, the second nonmagnetic layer, and the fourth nonmagnetic layer.

2. The memory according to claim 1, wherein the first magnetic layer is made of the same material as that forming the recording layer, and has magnetic anisotropy parallel to a film surface.

3. The memory according to claim 1, wherein a material of the third nonmagnetic layer is the same as that of the first nonmagnetic layer.

4. The memory according to claim 1, wherein an upper surface of the first nonmagnetic layer has a concave portion above the third nonmagnetic layer.

5. The memory according to claim 1, wherein the reference layer continuously extends over the plurality of magnetoresistance elements in a first direction, and is physically separated for at least each of the plurality of magnetoresistance elements in a second direction perpendicular to the first direction.

6. The memory according to claim 5, wherein magnetization directions in adjacent separated reference layers are antiparallel.

7. The memory according to claim 1, wherein the recording layer is made of one of FeB and CoFeB.

8. The memory according to claim 1, wherein the reference layer has a perovskite structure in which an electric current flowing parallel to the film surface is smaller than that flowing perpendicularly to the film surface, and which is aligned perpendicularly to the film surface.

9. The memory according to claim 1, wherein
the second nonmagnetic layer is made of a material containing at least one element selected from the group consisting of Ta, Y, La, Ti, Zr, Hf, Mo, W, Ru, Ir, Pd, Pt, and Al,
the third nonmagnetic layer is made of an oxide containing at least one element selected from the group consisting of Mg, Al, and Si, and
the fourth nonmagnetic layer is made of a nitride containing at least one element selected from the group consisting of Si and Al.

10. The memory according to claim 1, further comprising:
a selection transistor having a source and a drain, one of which is electrically connected to the recording layer;
a first wiring connected to a gate of the selection transistor and running in the second direction;
a second wiring electrically connected to the reference layer and running in the first direction; and
a third wiring electrically connected to the other of the source and the drain of the selection transistor and running in the first direction,
wherein the recording layer is formed between the first nonmagnetic layer and the selection transistor.

* * * * *